United States Patent
Iida (10) Patent No.: US 8,110,859 B2
(45) Date of Patent: Feb. 7, 2012

(54) ANTIREFLECTION PORTION IN A SHALLOW ISOLATION TRENCH FOR A PHOTOELECTRIC CONVERSION DEVICE

(75) Inventor: Satoko Iida, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 274 days.

(21) Appl. No.: 12/398,681

(22) Filed: Mar. 5, 2009

(65) Prior Publication Data

US 2009/0230491 A1 Sep. 17, 2009

(30) Foreign Application Priority Data

Mar. 13, 2008 (JP) .................................. 2008-064822

(51) Int. Cl.
*H01L 31/113* (2006.01)
(52) U.S. Cl. . 257/292; 257/432; 257/437; 257/E27.133; 257/E31.127
(58) Field of Classification Search .................. None
See application file for complete search history.

(56) References Cited

U.S. PATENT DOCUMENTS

| 5,239,193 | A  | * | 8/1993  | Benton et al. | ............... | 257/292 |
| 6,225,172 | B1 | * | 5/2001  | Manning | ..................... | 438/299 |
| 7,148,525 | B2 | * | 12/2006 | Mouli | ............................ | 257/233 |
| 7,279,764 | B2 | * | 10/2007 | Mouli | ............................ | 257/436 |
| 7,301,188 | B2 | * | 11/2007 | Kang | ............................. | 257/292 |
| 2002/0117731 | A1 | * | 8/2002 | Kim et al. | ...................... | 257/510 |
| 2004/0227061 | A1 | * | 11/2004 | Clevenger et al. | ......... | 250/214 R |
| 2006/0061674 | A1 |   | 3/2006 | Iida et al. | ....................... | 348/308 |
| 2006/0081890 | A1 |   | 4/2006 | Kang | ............................. | 257/233 |
| 2006/0131689 | A1 |   | 6/2006 | Tsukidate | ..................... | 257/506 |
| 2006/0138577 | A1 | * | 6/2006 | Hashimoto | ................... | 257/432 |
| 2007/0007563 | A1 | * | 1/2007 | Mouli | ............................ | 257/292 |
| 2009/0200625 | A1 | * | 8/2009 | Venezia et al. | ................ | 257/432 |

FOREIGN PATENT DOCUMENTS

| JP | 07-066282 A | 3/1995 |
| JP | 09-321131 A | 12/1997 |
| JP | 2002-057318 A | 2/2002 |
| JP | 2002-231929 A | 8/2002 |
| JP | 2006-114887 A | 4/2006 |
| JP | 2006-173491 A | 6/2006 |

* cited by examiner

*Primary Examiner* — Alonzo Chambliss
(74) *Attorney, Agent, or Firm* — Fitzpatrick, Cella, Harper & Scinto (57) ABSTRACT

A photoelectric conversion device includes a plurality of photoelectric conversion units each generating charges corresponding to light, an element isolation portion which electrically isolates the plurality of photoelectric conversion units, and an antireflection portion which is arranged to prevent reflection of light, which has entered the element isolation portion from above the element isolation portion, only on a bottom face of the element isolation portion or only on the bottom face and a lower part of a side face of the element isolation portion. In addition, a first semiconductor region is arranged below the element isolation portion. A refractive index of the antireflection portion takes a value between a refractive index of the element isolation portion and a refractive index of the first semiconductor region.

10 Claims, 10 Drawing Sheets

ANTIREFLECTION PORTION IN A SHALLOW ISOLATION TRENCH FOR A PHOTOELECTRIC CONVERSION DEVICE

BACKGROUND OF THE INVENTION

1. Field of the Invention

The present invention relates to a photoelectric conversion device, imaging system, and photoelectric conversion device manufacturing method.

2. Description of the Related Art

In a photoelectric conversion device such as a CMOS sensor, element isolation portions are formed in a semiconductor substrate to electrically isolate a plurality of photodiodes.

When STI (Shallow Trench Isolation) element isolation portions are formed in a semiconductor substrate, the space between a plurality of photodiodes can be narrowed. This can reduce, while suppressing a decrease of the area of photodiodes, an area occupied by the unit pixel of the photoelectric conversion device. When forming an STI element isolation portion, a trench is formed in the surface of a semiconductor substrate, and then an oxide film is buried in the trench. The oxide film buried in the trench sometimes applies a stress to the semiconductor substrate.

According to a technique disclosed in Japanese Patent Laid-Open No. 2006-173491, a trench is formed in the surface of a semiconductor substrate, and then a nitride film liner is formed to extend from the bottom and side faces of the trench to the surface of a nitride film on the semiconductor substrate. After that, an oxide film is buried in the trench. According to a technique disclosed in Japanese Patent Laid-Open No. 2006-173491, the nitride film liner can release the stress acting between the bottom faces of the element isolation portion and trench to the surface of the nitride film on the semiconductor substrate, and can thereby relax the stress acting between the bottom faces of the element isolation portion and trench.

To decrease the distance between photodiodes when forming STI element isolation portions in a semiconductor substrate, the element isolation portions need to be formed to a deep region in the semiconductor substrate in order to ensure satisfactory element isolation. In this case, a trench having a high aspect ratio (depth/width) is formed in a semiconductor substrate, and an oxide film is buried in the trench. The oxide film may not be sufficiently filled in the trench. That is, an element isolation portion containing a void near the bottom face may be formed.

According to a technique disclosed in Japanese Patent Laid-Open No. 9-321131, a trench is formed in the surface of a semiconductor substrate, and a silicon nitride film is formed on the bottom and side faces of the trench. Then, only the silicon nitride film on the bottom face is removed. After that, an oxide film is buried in the trench, and then annealing is executed to thermally oxidize the bottom face of the trench. By thermally oxidizing the bottom face of the trench, a thermal oxide film grows to fill a void present near the bottom face of the element isolation portion. According to a technique disclosed in Japanese Patent Laid-Open No. 9-321131, the oxide film can be satisfactorily filled even in a trench having a high aspect ratio. That is, an element isolation portion free from any void can be formed.

According to a technique disclosed in Japanese Patent Laid-Open No. 2002-57318, a trench is formed in the surface of a semiconductor substrate. A P-type impurity, the conductivity type of which is opposite to that of an impurity in a region where charges (electrons) are accumulated in a photodiode, is ion-implanted to the bottom and side faces of the trench. After that, an oxide film is buried in the trench, forming a small channel stop region. According to a technique disclosed in Japanese Patent Laid-Open No. 2002-57318, even when a small element isolation portion is formed by burying an oxide film in a trench having a high aspect ratio (depth/width), satisfactory element isolation can be ensured.

Recently, photoelectric conversion devices require a larger number of pixels in a predetermined chip area. It is necessary to reduce an area occupied by the unit pixel.

As described above, the area occupied by the unit pixel can be reduced by forming an STI element isolation portion in a semiconductor substrate. The number of pixels in a predetermined chip area can be easily increased.

SUMMARY OF THE INVENTION

The present inventor has made studies to find out the following new problem.

As the area occupied by the unit pixel decreases, the distance between adjacent photodiodes (photoelectric conversion units) is sometimes decreased. In this case, the (horizontal) distance between wiring lines in a wiring layer arranged (vertically) between photodiodes and color filters may also be decreased. If the distance between the wiring lines decreases, light passing through a region between the wiring lines (an aperture which defines light entering a photodiode) diffracts. The ratio of light entering not a photodiode but an element isolation portion increases. Light entering the element isolation portion is often reflected by the side or bottom face of the element isolation portion. Not only the area of the photodiode decreases, but also the ratio of amount of light entering the photodiode to amount of light having passed through the color filter decreases. As a result, the sensitivity of the photodiode may decrease.

It is an aim of the present invention to suppress a decrease in the sensitivity of a photoelectric conversion unit even when the distance between photoelectric conversion units is decreased in a photoelectric conversion device.

According to the first aspect of the present invention, there is provided a photoelectric conversion device comprising: a plurality of photoelectric conversion units each generating charges corresponding to light; an element isolation portion which electrically isolate the plurality of photoelectric conversion units; and an antireflection portion which are arranged to prevent reflection of light, which has entered the element isolation portion from above the element isolation portion, only on a bottom face of the element isolation portion or only on the bottom face and a lower part of a side face of the element isolation portion.

According to the second aspect of the present invention, there is provided an imaging system comprising: a photoelectric conversion device according to the first aspect of the present invention; an optical system which forms an image on an image sensing surface of the photoelectric conversion device; and a signal processing unit which processes a signal output from the photoelectric conversion device to generate image data.

According to the third aspect of the present invention, there is provided a method of manufacturing a photoelectric conversion device having a semiconductor substrate, the method comprising: a first step of forming a trench in a region of a surface of the semiconductor substrate where an element isolation portion is to be formed, the isolation portion electrically isolate a plurality of photoelectric conversion units, each photoelectric conversion unit generating charges corresponding to light; a second step of forming an antireflection portion only on a bottom face of the trench or only on the bottom face and a lower part of a side face of the trench such that the antireflection portion prevents reflection of light, which has entered the element isolation portion from above the element isolation portion, only on a bottom face of the element isolation portion or only on the bottom face and a lower part of a side face of the element isolation portion; and a third step of forming the element isolation portion by burying an insulation film in the trench after the second step.

The present invention can suppress a decrease in the sensitivity of a photoelectric conversion unit even when the distance between photoelectric conversion units is decreased in a photoelectric conversion device.

Further features of the present invention will become apparent from the following description of exemplary embodiments with reference to the attached drawings.

DESCRIPTION OF THE EMBODIMENTS

The present invention is directed to a photoelectric conversion device used in a digital still camera, digital video camera, and the like, and a manufacturing method thereof. In the following description, "reducing reflectance" at an interface between a first target and a second target means reducing the reflectance by adjusting, when an incident light enter an antireflection portion, a first light reflected at an interface between the first target and the antireflection portion and a second light reflected at an interface between the antireflection portion and the second target such that the first light and the second light weaken each other.

Figure 1:
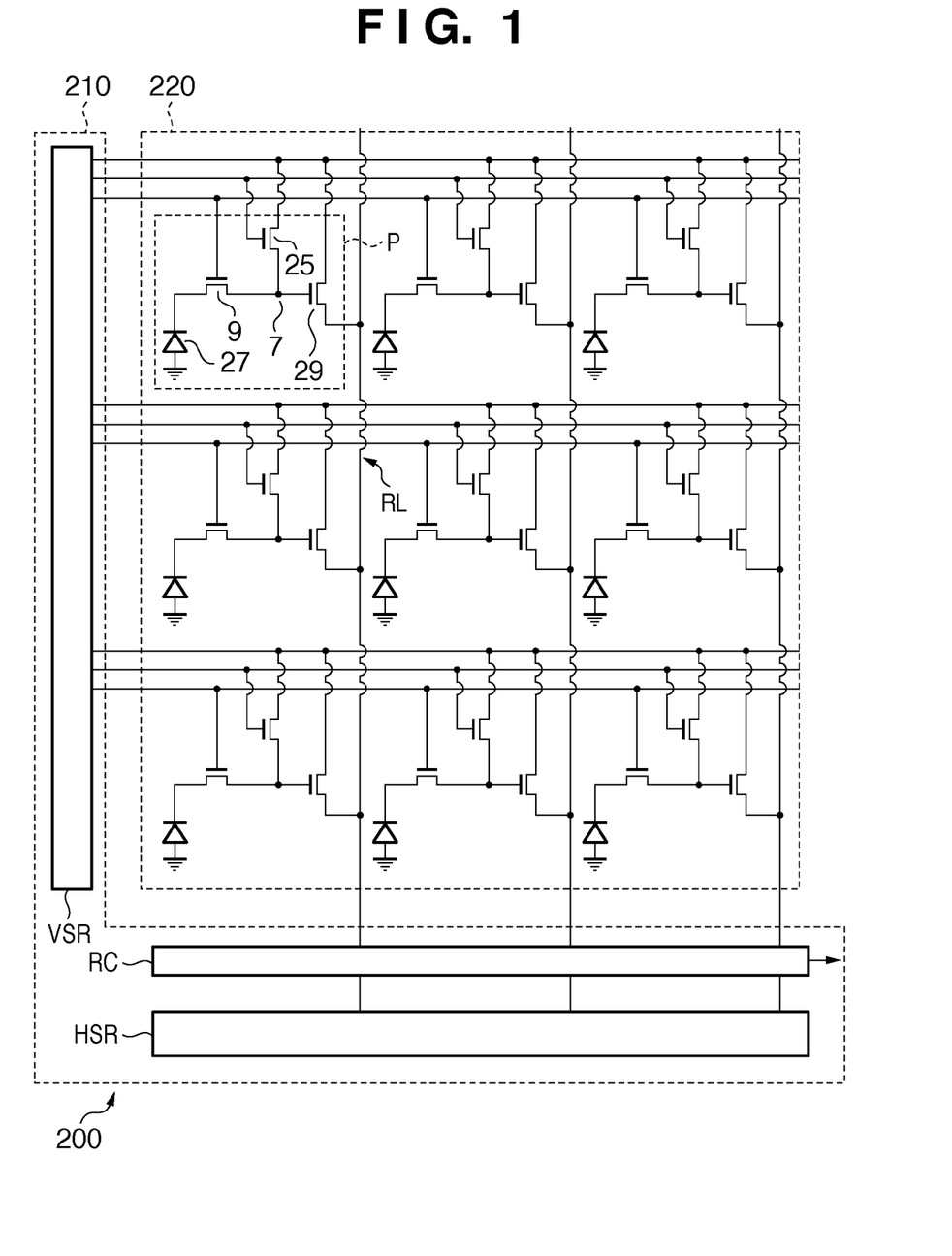
FIG. 1 is a circuit diagram showing the circuit arrangement of a photoelectric conversion device according to the first embodiment of the present invention.
Figure 2:
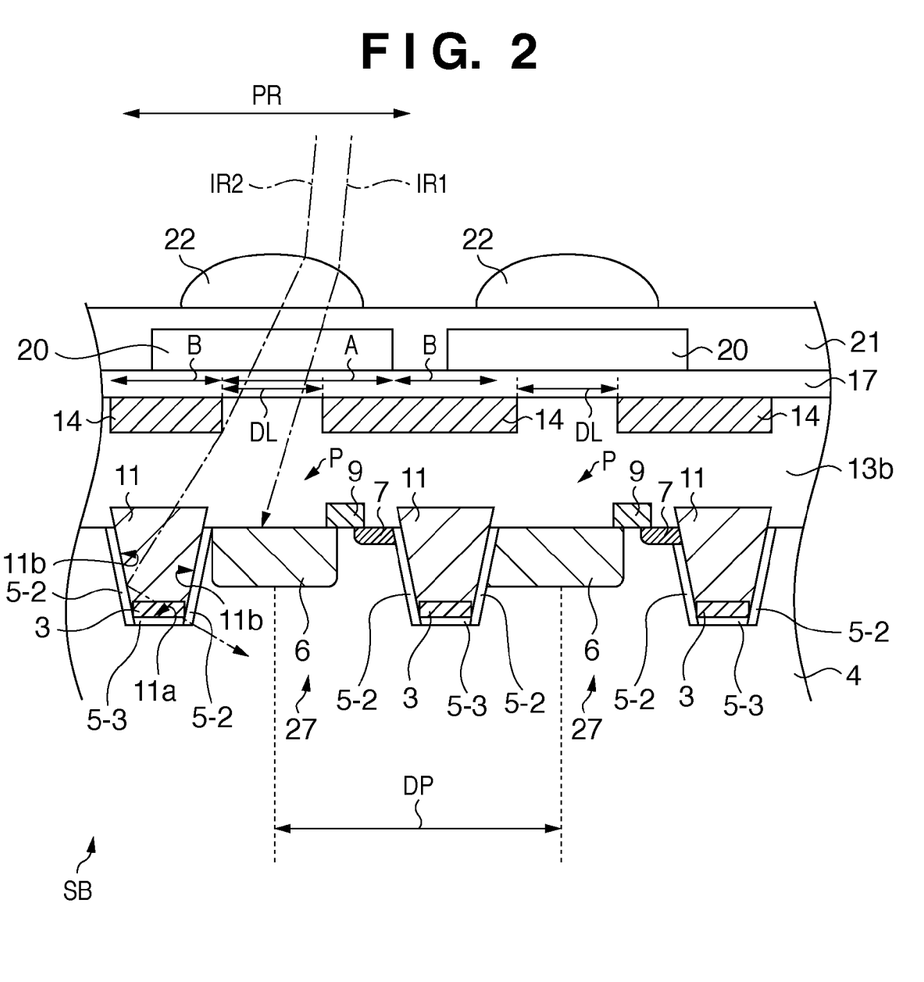
FIG. 2 is a sectional view showing the sectional structure of the photoelectric conversion device according to the first embodiment of the present invention.

The schematic arrangement of a photoelectric conversion device 200 according to the first embodiment of the present invention will be explained with reference to FIG. 1. FIG. 1 is a circuit diagram showing the circuit arrangement of the photoelectric conversion device 200 according to the first embodiment of the present invention. FIG. 2 is a sectional view showing the sectional structure of the photoelectric conversion device 200 according to the first embodiment of the present invention.

The photoelectric conversion device 200 has a semiconductor substrate SB (see FIG. 2). The semiconductor substrate SB includes a pixel array region 220 and peripheral region 210.

The peripheral region 210 is positioned around the pixel array region 220. A control circuit and the like are arranged in the peripheral region 210. The control circuit includes a circuit for controlling a plurality of pixels P in the pixel array region 220, and a circuit for outputting signals from the pixels P. The control circuit includes, for example, a vertical scanning circuit VSR for scanning the rows of the pixels P, a readout circuit RC for reading out signals from pixels P on respective columns, and a horizontal scanning circuit HSR for scanning the columns of the readout circuit. The readout circuit RC includes, for example, a circuit for amplifying a signal from the pixel P, a circuit for holding a signal, and an output line and switch for outputting a signal.

In the pixel array region 220, a plurality of pixels P is arrayed in directions along the row and column. Each pixel P includes a reset transistor 25, photoelectric conversion unit 27, transfer gate 9, floating diffusion (to be referred to as an FD hereinafter) 7, and amplification transistor 29. The reset transistor 25 resets the FD 7 to a desired potential. The photoelectric conversion unit 27 generates charges corresponding to incident light (e.g., incident light IR1 shown in FIG. 2) by photoelectric conversion, and accumulates them. The photoelectric conversion unit 27 is, for example, a photodiode. The transfer gate 9 transfers charges (signal) accumulated in the photoelectric conversion unit 27 to the FD 7. The amplification transistor 29 forms part of a source follower circuit, and the FD 7 serves as its input. The remaining part of the source follower circuit is formed of a constant current source (not shown) connected to a column signal line RL. The amplification transistor 29 amplifies a signal output from the FD 7, and outputs the amplified signal to the column signal line RL. In this way, a signal is read out from the pixel P.

A section which pays attention to the pixels P in the photoelectric conversion device 200 having the above-described pixels P will be explained with reference to FIG. 2. The semiconductor substrate SB mainly includes, for example, an N-type semiconductor. A well region 4 may be of the N or P type. In the embodiment, the well region 4 is of the N type.

In a region PR corresponding to one pixel P (see FIG. 1) in the pixel array region 220, a charge accumulation region 6 which forms part of the photoelectric conversion unit 27, an element isolation portion 11, a first semiconductor region 5-3, a second semiconductor region 5-2, a wiring layer 14, interlayer insulation films 13b and 17, a color filter 20, an antireflection portion 3, a planarized layer 21, and a microlens 22 are arranged. The element isolation portions 11 are STI element isolation portions, and electrically isolate, by STI, a plurality of elements (the elements 25, 27, 7, 9, 29, and the like shown in FIG. 1) included in each pixel P, and a plurality of elements between a plurality of pixels P. For example, the element isolation portions 11 electrically isolate a plurality of photoelectric conversion units 27 included in different pixels P. The element isolation portion 11 is formed of, for example, silicon oxide.

The first semiconductor region 5-3 is arranged below the element isolation portion 11. The first semiconductor region 5-3 contains an impurity of a conductivity type (P type) opposite to that of the charge accumulation region 6 at a concentration higher than that of the well region 4. The first semiconductor region 5-3 has a function of preventing charges accumulated in the charge accumulation region 6 from leaking to the charge accumulation region 6 of an adjacent pixel P, and a function of suppressing generation of a leakage current via the defect of the element isolation portion 11.

The second semiconductor region 5-2 is arranged adjacent to the side of the element isolation portion 11. The second semiconductor region 5-2 contains an impurity of a conductivity type (P type) opposite to that of the charge accumulation region 6 at a concentration higher than a concentration of an N type impurity of the well region 4. The second semiconductor region 5-2 has a function of preventing charges accumulated in the charge accumulation region 6 from leaking to the charge accumulation region 6 of an adjacent pixel P, and has a function of suppressing generation of a leakage current via the defect of the element isolation portion 11.

The wiring layer 14 functions as a wiring line for supplying a signal from the vertical scanning circuit VSR to each pixel P, and a wiring line (e.g., the column signal line RL) for transferring a signal output from each pixel P. The wiring layer 14 is formed from a conductive material such as a metal. For descriptive convenience, wiring lines of the second and subsequent layers are not illustrated in FIG. 2.

The interlayer insulation films 13b and 17 are arranged to insulate the wiring layer 14 from another layer. The interlayer insulation films 13b and 17 are formed from an insulator such as silicon oxide.

The color filters 20 are arranged above the respective photoelectric conversion units 27. The color filters 20 are primary color filters corresponding to, for example, three primary colors (R, G, and B).

The planarized layer 21 is formed on the color filters 20 and on a layer 19, and its upper surface is planarized by CMP or the like. The planarized layer 21 is formed of, for example, a resin similar to a resist.

The microlens 22 guides incident light (e.g., incident light IR1 and incident light IR2) to an region between wiring lines of the wiring layer 14. Part (e.g., the incident light IR1) of the light guided to the region between the wiring lines of the wiring layers 14 enters the photoelectric conversion unit 27. Another part (e.g., the incident light IR2) diffracts and enters the element isolation portion 11.

The antireflection portion 3 is arranged on only the bottom face of the element isolation portion 11. The antireflection portion 3 is arranged to reduce the reflectance of an interface 11a (i.e., a bottom face 11a of the element isolation portion 11) between the element isolation portion 11 and the first semiconductor region 5-3. This structure can guide, from the bottom face 11a of the element isolation portion 11 to the first semiconductor region 5-3, light (e.g., the incident light IR2) entering the element isolation portion 11 from above it. "Arranged on only the bottom face 11a" means that the antireflection portion 3 is designed to be arranged on only the bottom face 11a, and includes a case wherein an actually manufactured antireflection portion 3 is partially formed on a side face 11b owing to manufacturing fluctuation. The refractive index of the antireflection portion 3 takes a value between the refractive index of the element isolation portion 11 and that of the first semiconductor region 5-3. The antireflection portion 3 has a thickness enough to prevent reflection of light having passed through the color filter 20. The antireflection portion 3 is formed of, for example, silicon nitride.

As the area occupied by the unit pixel P decreases, the area of the photoelectric conversion unit 27 sometimes decreases, and a distance DP between adjacent photoelectric conversion units 27 also decreases. In this case, an distance DL between the wiring lines of the wiring layer 14 which are arranged between the photoelectric conversion units 27 and the color filters 20 and above the photoelectric conversion units 27 may also decrease. The result (see FIG. 4) of a simulation performed by the present inventor shows that, as the distance DL between the wiring lines of the wiring layer 14 decreases, the ratio of amount of light entering not the photoelectric conversion unit 27 but the element isolation portion 11 upon diffraction to amount of light having passed through the region between the wiring lines of the wiring layer 14 increases. Light entering the element isolation portion 11 is often reflected by the side face 11b and bottom face 11a of the element isolation portion 11. Not only the area of the photoelectric conversion unit 27 decreases, but also the ratio of amount of light entering the photoelectric conversion unit 27 to amount of light having passed through the color filter 20 decreases. As a result, the sensitivity of the photoelectric conversion unit 27 may decrease. Since light entering the element isolation portion 11 cannot be guided to the photoelectric conversion unit 27 and be reflected by the element isolation portion 11, the reflected light is further reflected by the wiring layer above the element isolation portion 11, and thereby enters a pixel spaced apart by two or three pixels. Such light may act as stray light.

Figure 4:
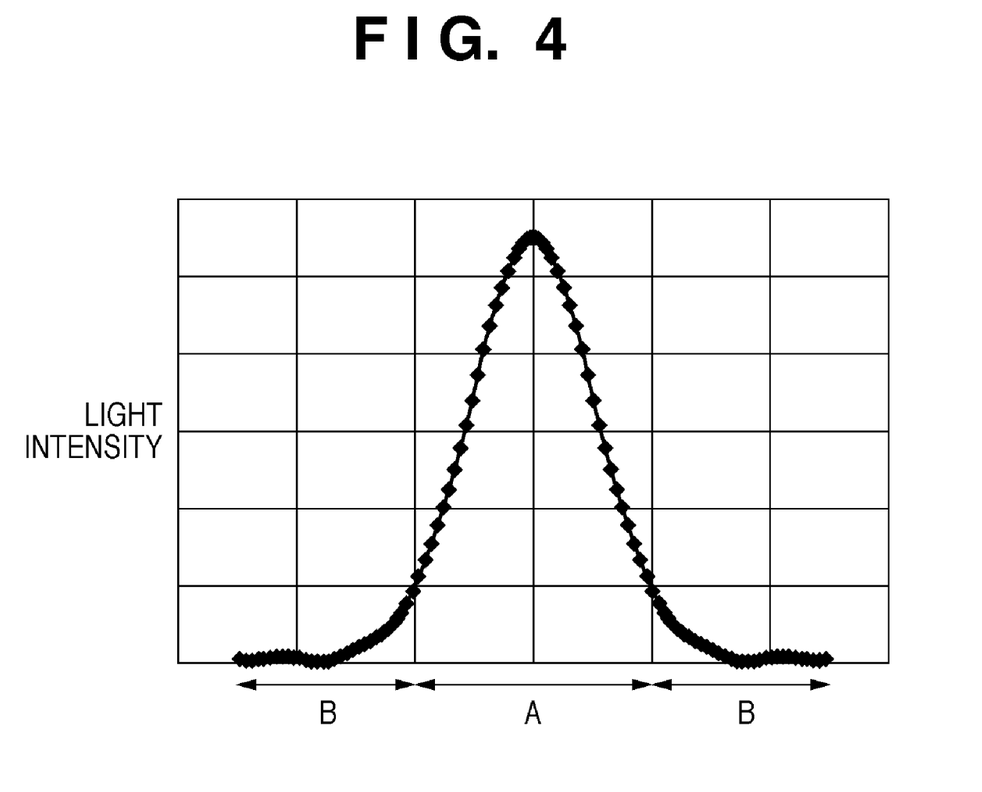
FIG. 4 is a graph showing the result of a simulation performed by the present inventor.

The simulation result in FIG. 4 will be explained. FIG. 4 shows a light intensity distribution in regions A and B shown in FIG. 2 when the distance DL between the wiring layers 14 is about 1 μm, the vertical distance from the wiring layer 14 to the surface of the photoelectric conversion unit 27 is about 0.8 μm, and the wavelength of incident light is 550 nm. Region A is an active region defined by the element isolation portions 11. Region B is an element isolation region where the element isolation portion 11 is formed. As is apparent from FIG. 4, about 10% of amount of light entering the region between the wiring lines of the wiring layer 14 reaches region B, that is, the element isolation portion 11. In FIG. 4, the ordinate axis uses an arbitrary unit where a peak intensity is 1.

To the contrary, according to the first embodiment, the antireflection portion 3 can guide, from the bottom face 11a of the element isolation portion 11 to the photoelectric conversion unit 27, light (e.g., the incident light IR2) entering the element isolation portion 11 from above it. More specifically, light diffracted and guided to the element isolation portion 11 out of light guided to the region between the wiring lines of the wiring layer 14 passes through the antireflection portion 3, and at least part of the light is guided to the photoelectric conversion unit 27. The photoelectric conversion unit 27 can generate not only charges corresponding to light (e.g., the incident light IR1) entering it, but also charges corresponding to light (e.g., the incident light IR2) entering the element isolation portion 11. The generated charges are accumulated in the charge accumulation region 6. Light guided to the element isolation portion 11 passes through the antireflection portion 3, and at least part of it is photoelectrically converted to generate charges. The generated charges are guided to the photoelectric conversion unit 27 and accumulated in the charge accumulation region 6. As a result, even when the distance between the photoelectric conversion units 27 is decreased to increase the ratio of amount of light entering not the photoelectric conversion unit 27 but the element isolation portion 11, a decrease in the sensitivity of the photoelectric conversion unit 27 can be suppressed.

There exists a possibility that light entering (or thereby generated charges) in the well region 4 via the antireflection portion 3 may enter (or reach) an adjacent pixel P. However, color mixture between adjacent pixels can be corrected easier than that caused by light entering a pixel spaced apart by two or three pixels. By arranging the antireflection portion 3 on only the bottom face 11a of the element isolation portion 11, color mixture can be easily corrected, and the sensitivity of the photoelectric conversion unit can be increased.

The antireflection portion 3 will be explained in detail. A case wherein the antireflection portion 3 is formed of silicon nitride will be exemplified.

When forming an STI element isolation portion 11, a trench is formed in the surface of the semiconductor substrate SB (well region 4), and silicon oxide is buried in the trench. The silicon oxide buried in the trench may apply a stress to the semiconductor substrate SB (well region 4).

A case wherein a trench is formed in the surface of the semiconductor substrate SB, and then a nitride film liner is formed of silicon nitride to cover a region extending from the bottom and side faces of the trench to the surface of the semiconductor substrate SB in order to relax the stress will be examined. In this case, silicon oxide is buried in the trench in which the nitride film liner is formed. The nitride film liner can release the stress acting between the bottom faces of the element isolation portion and trench to the surface of the semiconductor substrate, and can thereby relax the stress acting between the bottom faces of the element isolation portion and trench. The nitride film liner (silicon nitride) used to relax the stress has a refractive index of 2.0 between a refractive index "1.46" of the element isolation portion 11 (silicon oxide) and a refractive index "4.0" of the bottom face (silicon) of the trench. In many cases, the nitride film liner used to relax the stress is about 5 nm to 15 nm in film thickness, and does not function as an antireflection film.

On the contrary, the antireflection portion 3 (silicon nitride) according to the embodiment has a refractive index of 2.0 between the refractive index "1.46" of the element isolation portion 11 (silicon oxide) and the refractive index "4.0" of the bottom face (silicon) of the trench. In addition, the antireflection portion 3 has a film thickness satisfying $$2nd \cdot \cos \beta = (m - 1/2)\lambda \quad (1)$$

where m is an integer, d is the film thickness of the antireflection portion 3, n is the refractive index of the antireflection portion 3, β is the refraction angle of light entering the antireflection portion 3, and λ is the wavelength of light entering the antireflection portion 3. Equation (1) represents a condition to cancel, with each other, light reflected by the interface between the element isolation portion 11 and the antireflection portion 3 while inverting the phase, and light reflected by the interface between the antireflection portion 3 and the bottom face of the trench while inverting the phase. More specifically, the antireflection portion 3 can function as an antireflection film as long as the difference in optical path between light reflected by the interface between the element isolation portion 11 and the antireflection portion 3 and light reflected by the interface between the antireflection portion 3 and the bottom face of the trench satisfy the relation "an integer multiple of the wavelength λ+wavelength/2". A film thickness which meets equation (1) takes a value enough to prevent reflection of light having passed through the color filter 20.

For example, from equation (1), the film thickness of an antireflection portion 3 arranged below a color filter 20 whose spectral transmittance peaks at 620 nm (red light) is preferably 40 nm to 105 nm.

For example, from equation (1), the film thickness of an antireflection portion 3 arranged below a color filter 20 whose spectral transmittance peaks at 560 nm (green light) is preferably 35 nm to 95 nm.

For example, from equation (1), the film thickness of an antireflection portion 3 arranged below a color filter 20 whose spectral transmittance peaks at 460 nm (blue light) is preferably 30 nm to 78 nm.

In the photoelectric conversion device 200 having the above-mentioned color filters 20, the antireflection portion 3 has a film thickness of 30 nm (inclusive) to 105 nm (inclusive). The antireflection portions 3 having film thicknesses corresponding to the respective colors suffice to be arranged. When forming antireflection portions having the same film thickness in all pixels, the film thickness preferably falls within the range of 40 nm (inclusive) to 78 nm (inclusive).

Figure 5:
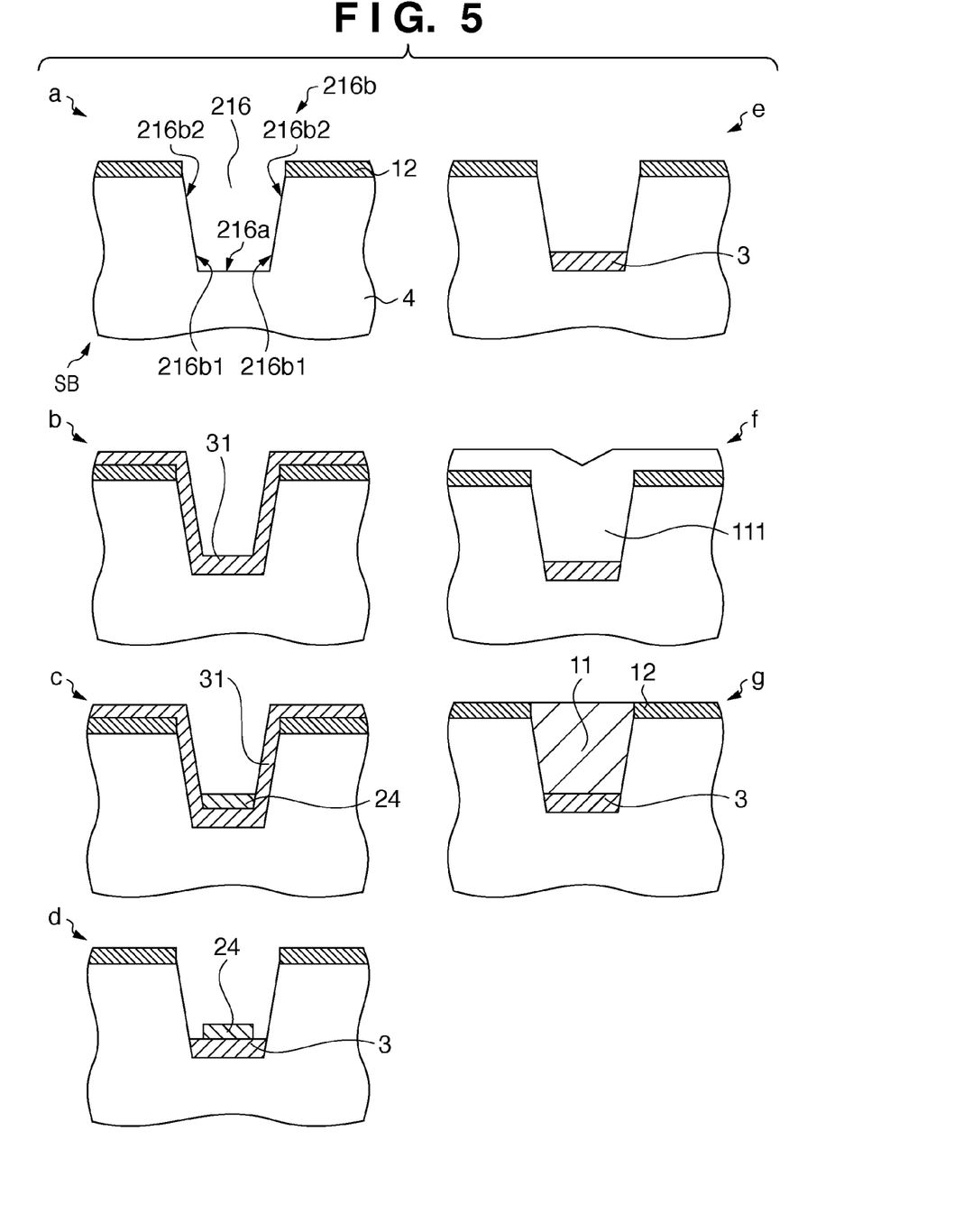
FIG. 5 is a sectional view showing steps in a method of manufacturing an element isolation portion in the pixel array region of the photoelectric conversion device.

A method of manufacturing an element isolation portion in the pixel array region of the photoelectric conversion device according to the present invention will be explained with reference to FIG. 5. FIG. 5 is a sectional view showing steps in the method of manufacturing an element isolation portion in the pixel array region of the photoelectric conversion device.

In step a (first step) of FIG. 5, impurity ions are implanted into a semiconductor substrate SB to form a well region 4. A silicon nitride film 12 is formed on the surface of the semiconductor substrate SB by CVD or the like. In a partial region of the pixel array region 220 where the element isolation portion 11 is to be formed, the surface of the semiconductor substrate SB is etched to form a trench 216 in the surface of the semiconductor substrate SB.

More specifically, in the pixel array region 220, a silicon nitride film pattern 12 is formed using photolithography, and the semiconductor substrate SB is anisotropically etched using the silicon nitride film pattern 12 as a mask, thereby forming a trench 216 in the semiconductor substrate SB. The trench 216 is formed to construct a STI type structure, and has a high aspect ratio (depth/width).

In step b of FIG. 5, a first insulation film 31 is formed on a bottom face 216a and side face 216b (see FIG. 5) of the trench 216 by CVD or the like. The first insulation film 31 is formed of, for example, silicon nitride.

For example, when LP-CVD (Low Pressure CVD) is performed, the pressure in the furnace is set to about 150 to 250 Pa, the temperature in the furnace is set to about 600° C. to 800° C., and $SiH_2CL_2+NH_3$ source gas is used.

Alternatively, for example, when PE-CVD (Plasma Enhanced CVD) is performed, the temperature in the chamber is set to about 350° C., and $SiH_2CL_2+NH_3$ source gas is used.

In step c of FIG. 5, a resist 24 is formed only on a part of the first insulation film 31 that is formed on the bottom face 216a (see FIG. 5) of the trench 216.

In step d (second step) of FIG. 5, isotropic etching is performed using the resist 24 as a mask. More specifically, a part of the first insulation film 31 (see c in FIG. 5) that is arranged on the side face 216b (see FIG. 5) of the trench 216 is etched to leave a part of the first insulation film 31 that is arranged on the bottom face 216a of the trench 216, thereby forming an antireflection portion 3.

In step e of FIG. 5, the resist 24 is removed using a chemical solution such as sulfuric acid.

In step f of FIG. 5, a second insulation film 111 is buried in the trench 216 by HDP (High Density Plasma) or the like. The second insulation film 111 is formed of, for example, silicon oxide.

In step g (third step) of FIG. 5, the surface of the second insulation film 111 is planarized by CMP or the like, forming an element isolation portion 11. At this time, the silicon nitride film 12 functions as a stopper when planarizing the surface by CMP or the like. After the silicon nitride film 12 is removed, a general manufacturing process is executed, manufacturing a photoelectric conversion device in FIG. 2.

Figure 3:
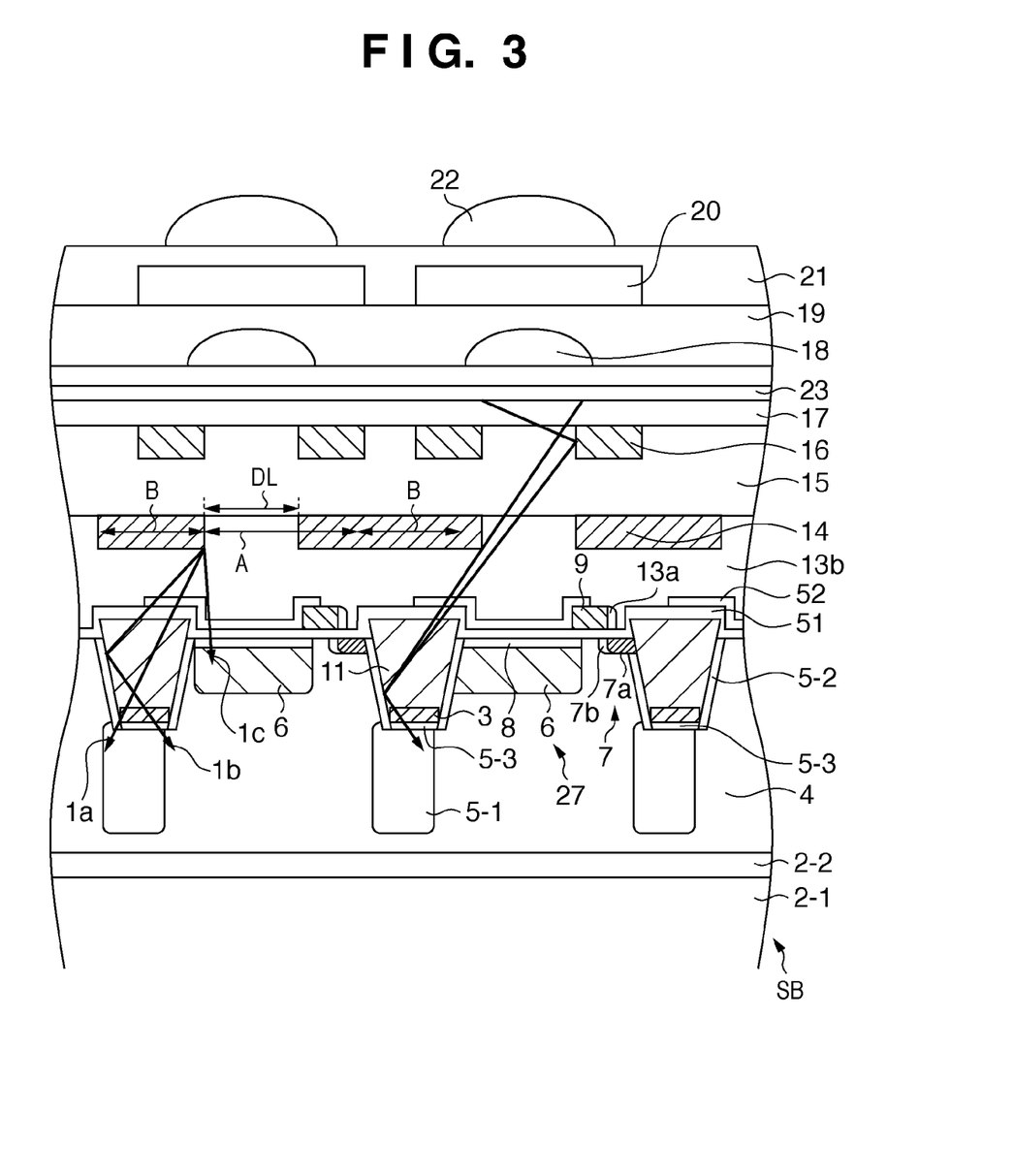
FIG. 3 is a sectional view showing the sectional structure of the photoelectric conversion device according to a modification to the first embodiment of the present invention.

Modified embodiment of the photoelectric conversion device in FIG. 2 will be explained with reference to FIG. 3. In FIG. 3, a buried impurity layer 2-2, isolation impurity layer (rectangular portion below the element isolation portion 11 in FIG. 3) 5-1, protective layer 8, inter-layer lens 18, and the like are further arranged in the structure of FIG. 2.

As shown in FIG. 3, the buried impurity layer 2-2 may also be formed at a position deep in the semiconductor substrate SB in at least the pixel array region 220 of the semiconductor substrate SB. The buried impurity layer 2-2 has a conductivity type opposite to that of the charge accumulation region 6, and electrically isolates an underlying region 2-1 and the well region 4.

The isolation impurity layer 5-1 is arranged below the element isolation portion 11. The isolation impurity layer 5-1 has the same conductivity type as that of the buried impurity layer 2-2. The isolation impurity layer 5-1 forms a potential barrier which prevents charges generated at a deep portion below the charge accumulation region 6 in the well region 4 from leaking to the photoelectric conversion unit 27 of an adjacent pixel P. The isolation impurity layer 5-1 also has a function of guiding charges generated by light having passed through the antireflection portion 3 to the charge accumulation region 6. The central axis of the impurity concentration of the isolation impurity layer 5-1 may also be arranged in correspondence with the optical axis of incident light.

As shown in FIG. 3, the photoelectric conversion unit 27 may also be a buried type photodiode. In this case, the photoelectric conversion unit 27 includes the charge accumulation region 6 and protective layer 8. The protective layer 8 is a region containing an impurity of a conductivity type opposite to that of the charge accumulation region 6, and is configured to prevent exposure of the charge accumulation region 6 as the surface. A gate oxide film 51 may also be formed on the protective layer 8, and an antireflection silicon nitride film 52 may also be formed on the gate oxide film 51. The silicon nitride film 52 covers, for example, the protective layer 8 and almost half of the electrode surface of the transfer gate 9. A side wall film 13a is formed on the side face of the electrode on the floating diffusion side of the transfer gate 9. The side wall film 13a is formed by, for example, forming a silicon oxide film to cover the transfer gate 9, and etching back the silicon oxide film. Along with this, the FD 7 includes a holding region 7a and an LDD (Lightly Doped Drain) region 7b. The holding region 7a is an impurity region of the same conductivity type as that of the charge accumulation region 6, and holds charges transferred from the transfer gate 9. The LDD region 7b has the same conductivity type as that of the holding region 7a, is an impurity region doped more lightly than the holding region 7a, and is interposed between the transfer gate 9 and the holding region 7a. No LDD region may also be formed, and the silicon nitride film 52 may also be formed in a plurality of pixels P.

An interlayer insulation film 15 and wiring layer 16 of the second and subsequent layers may also be formed on the wiring layer 14. The wiring layers 14 and 16 may also be formed in three or more layers. In addition to a function of transferring an electrical signal, the wiring layers 14 and 16 may also function as a light shielding layer for preventing entrance of light into a region other than the photoelectric conversion unit 27.

The inter-layer lens 18 of a plasma nitride film may also be arranged above the interlayer insulation film 17 via a silicon oxy-nitride film 23. The inter-layer lens 18 is arranged above the photoelectric conversion unit 27. The interlayer insulation films 13b, 15, and 17 are transparent to incident light. As shown in FIG. 3, the inter-layer lens 18 is formed into a so-called upward convex shape which projects toward the microlens 22 for receiving light. The silicon oxy-nitride film 23 is formed between the inter-layer lens 18 and the interlayer insulation film 17 to reduce reflection at the interface between the inter-layer lens 18 and the interlayer insulation film 17. The silicon oxy-nitride film 23 is also transparent to incident light. The refractive index (about 1.68) of the silicon oxy-nitride film 23 takes a value between the refractive index (about 2.04) of silicon nitride which forms the inter-layer lens 18, and the refractive index (about 1.46) of silicon oxide which forms the interlayer insulation film 17. The film thickness of the silicon oxy-nitride film 23 takes a value which satisfies equation (1). This structure can suppress a loss caused by reflection at the interface between the inter-layer lens 18 and the interlayer insulation film 17. Most of light entering the microlens 22 passes through the inter-layer lens 18 and silicon oxy-nitride film 23, and is efficiently converged to the photoelectric conversion unit (photodiode) 27.

Figure 6:
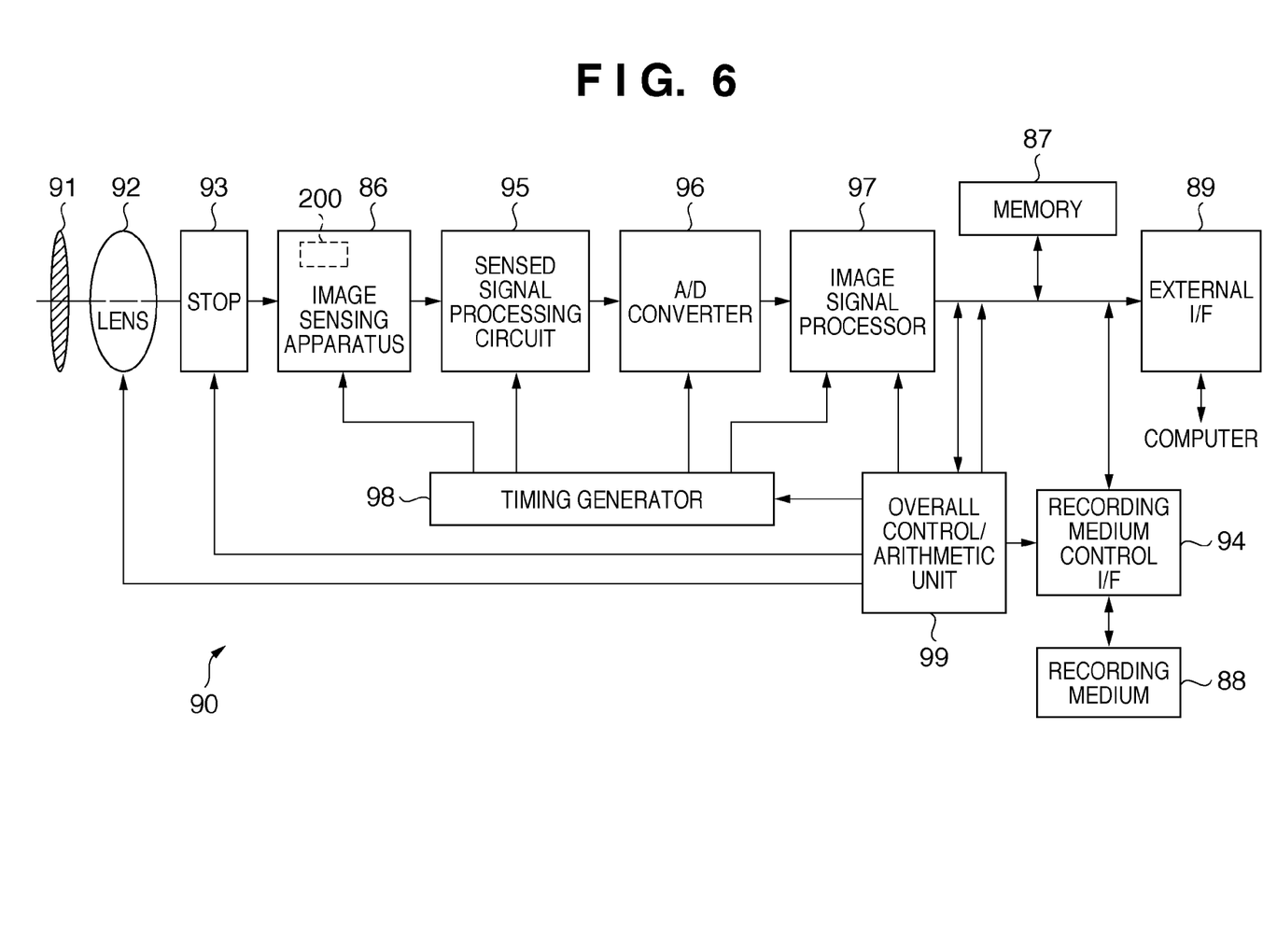
FIG. 6 is a block diagram showing the configuration of an imaging system to which the photoelectric conversion device according to the first embodiment is applied.

FIG. 6 shows an example of an imaging system to which the photoelectric conversion device according to the present invention is applied.

As shown in FIG. 6, an imaging system 90 mainly includes an optical system, image sensing apparatus 86, and signal processing unit. The optical system mainly includes a shutter 91, lens 92, and stop 93. The image sensing apparatus 86 includes the photoelectric conversion device 200. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88.

The shutter 91 is arranged in front of the lens 92 on the optical path to control the exposure.

The lens 92 refracts incident light to form an object image in the pixel array region of the photoelectric conversion device 200 of the image sensing apparatus 86.

The stop 93 is interposed between the lens 92 and the photoelectric conversion device 200 on the optical path. The stop 93 adjusts the quantity of light guided to the photoelectric conversion device 200 after passing through the lens 92.

The photoelectric conversion device 200 of the image sensing apparatus 86 converts an object image formed in the pixel array region 220 into an image signal. The photoelectric conversion device 200 of the image sensing apparatus 86 reads out the image signal from the pixel array region 220, and outputs it.

The sensed signal processing circuit 95 is connected to the image sensing apparatus 86, and processes an image signal output from the image sensing apparatus 86.

The A/D converter 96 is connected to the sensed signal processing circuit 95. The A/D converter 96 converts a processed image signal (analog signal) output from the sensed signal processing circuit 95 into an image signal (digital signal).

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., a personal computer) via the external I/F 89.

The timing generator 98 is connected to the image sensing apparatus 86, sensed signal processing circuit 95, A/D converter 96, and image signal processor 97. The timing generator 98 supplies timing signals to the image sensing apparatus 86, sensed signal processing circuit 95, A/D converter 96, and image signal processor 97. The image sensing apparatus 86, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the photoelectric conversion device 200 can provide a high-quality image (image data) as long as it can obtain a high-quality image signal.

A photoelectric conversion device 300 according to the second embodiment of the present invention will be explained with reference to FIG. 7. A difference from the first embodiment will be mainly explained, and a description of the same part will not be repeated.

In a pixel array region 320 of the photoelectric conversion device 300, an antireflection portion 303 is arranged instead of the antireflection portion 3. The antireflection portion 303 is configured such that reflection of light entering an element isolation portion 11 from above it is prevented only on a bottom face 11a and a lower part 11b1 of the side face 11b of the element isolation portion 11. More specifically, the antireflection portion 303 extends from the bottom face 11a of the element isolation portion 11 to the lower part 11b1 of the side face, but does not extend to an upper part 11b2 of the side face. If the antireflection portion 303 is formed on the upper part of the side face, light enters an adjacent pixel. Therefore, although the antireflection portion 303 is not preferably arranged on the upper part of the side face of the element isolation portion 11, the antireflection portion 303 is preferably arranged on the lower part of the side face of the element isolation portion 11. This structure enables efficiently guiding incident light into the photoelectric conversion unit 27.

The "lower part 11b1 of the side face" is defined as a region in the side face 11b of the element isolation portion 11 that extends from an edge portion of the bottom face 11a of the element isolation portion 11 to ½ of the height of the element isolation portion 11. The "upper part 11b2 of the side face" is a region in the side face 11b of the element isolation portion 11 that extends from an edge portion of an upper face 11c of the element isolation portion 11 to ½ of the depth of the element isolation portion 11. Most of light (e.g., incident light IR2) diffracted and obliquely guided to the element isolation portion 11 out of light guided to the region between the wiring lines of the wiring layer 14 can be reflected by the upper part 11b2 of the side face 11b. Also when the antireflection portion 303 is arranged only on the bottom face 11a and the lower part 11b1 of the side face 11b, light guided to the element isolation portion 11 can be prevented from entering the element isolation portion 11 of an adjacent pixel, and can also be guided to the element isolation portion 11 of a desired pixel. "Arranged only on the bottom face 11a and the lower part 11b1 of the side face 11b" means that the antireflection portion 303 is designed to be arranged only on the bottom face 11a and the lower part 11b1 of the side face 11b, and includes a case wherein an actually manufactured antireflection portion 303 extends to less than ½ of the height from the bottom face 11a, as shown in FIG. 7.

A method of manufacturing an element isolation portion in the pixel array region of the photoelectric conversion device is different from the first embodiment in the following points.

In steps c and d of FIG. 5, a resist 24 is formed thicker than that in the first embodiment. A part of a first insulation film 31 that is arranged on the upper part (the upper part 216b2 in a of FIG. 5) of the side face 216b of the trench 216 is etched to leave a part of the first insulation film 31 that is arranged on the bottom face 216a and the lower part 216b1 of the side face 216b of the trench 216, thereby forming an antireflection portion 303.

Figure 8:
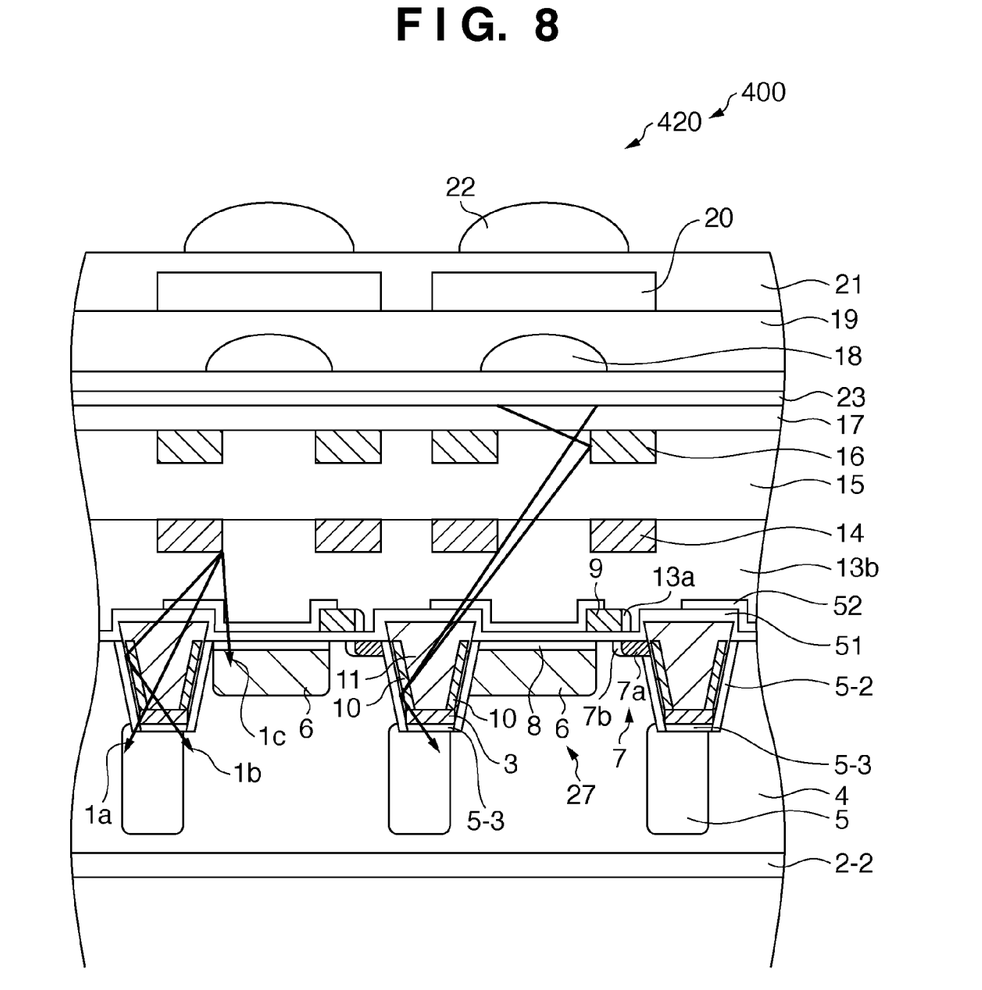
FIG. 8 is a sectional view showing the sectional structure of a photoelectric conversion device according to the third embodiment of the present invention.

A photoelectric conversion device 400 according to the third embodiment of the present invention will be explained with reference to FIG. 8. A difference from the first embodiment (see FIG. 2) and its modification (see FIG. 3) will be mainly explained, and a description of the same part will not be repeated.

In a pixel array region 420 of the photoelectric conversion device 400, a reflection portion 10 is arranged. The reflection portion 10 is configured such that light entering an element isolation portion 11 from above it is reflected in a region of a side face 11b of the element isolation portion 11 that includes at least the upper part of the side face. The reflection portion 10 is arranged to increase a reflectance at the interface (i.e., the side face 11b of the element isolation portion 11) between the element isolation portion 11 and a second semiconductor region 5-2. The difference between the refractive indices of the reflection portion 10 and second semiconductor region 5-2 is larger than that between the refractive indices of the element isolation portion 11 and second semiconductor region 5-2. The reflection portion 10 has a thickness enough to reflect light having passed through a color filter 20. The reflection portion 10 is formed of, for example, a material lower in refractive index than silicon oxide.

By arranging the reflection portion 10, light entering the element isolation portion 11 can efficiently pass through an antireflection film 3, and light entering an adjacent pixel can be reduced.

The reflection portion 10 will be explained in detail. A case wherein the reflection portion 10 is formed from $MgF_2$ will be exemplified.

The refractive index of $MgF_2$ is about 1.4. The difference between the refractive index "1.4" of the reflection portion 10 ($MgF_2$) and a refractive index "4.0" of the second semiconductor region 5-2 (silicon) is larger than that between a refractive index "1.46" of the element isolation portion 11 (silicon oxide) and the refractive index "4.0" of the second semiconductor region 5-2 (silicon). In addition to the refractive index "1.4", the reflection portion 10 ($MgF_2$) has a film thickness satisfying $$2 \cdot nd \cdot \cos \beta = m\lambda \quad (2)$$

where m is an integer, d is the film thickness of the reflection portion 10, n is the refractive index of the reflection portion 10, β is the refraction angle of light entering the reflection portion 10, and λ is the wavelength of light entering the reflection portion 10. Equation (2) represents a condition to enhance, with each other, light reflected by the interface between the element isolation portion 11 (silicon oxide) and the reflection portion 10 ($MgF_2$) without inverting the phase, and light reflected by the interface between the reflection portion 10 ($MgF_2$) and the side face (silicon) of the trench while inverting the phase. More specifically, the reflection portion 10 can function as a reflection film as long as the difference in optical path between light reflected by the interface between the element isolation portion 11 and the reflection portion 10 and light reflected by the interface between the reflection portion 10 and the side face of the trench satisfy the relation "an integer multiple of the wavelength λ". A film thickness which meets equation (2) takes a value enough to reflect light having passed through the color filter 20.

For example, from equation (2), the film thickness of a reflection portion 10 arranged below a color filter 20 whose spectral transmittance peaks at 620 nm (red light) is preferably 210 nm or more.

For example, from equation (2), the film thickness of a reflection portion 10 arranged below a color filter 20 whose spectral transmittance peaks at 560 nm (green light) is preferably 190 nm or more.

For example, from equation (2), the film thickness of a reflection portion 10 arranged below a color filter 20 whose spectral transmittance peaks at 460 nm (blue light) is preferably 150 nm or more.

The film thickness of the reflection portion 10 may also be changed in accordance with each color, or may also be set to 210 nm or more so as to satisfy all the conditions. The upper limit of this film thickness is, for example, ⅓ of the average width of the element isolation portion 11 as long as the element isolation portion 11 has a film thickness enough to electrically isolate elements.

Figure 9:
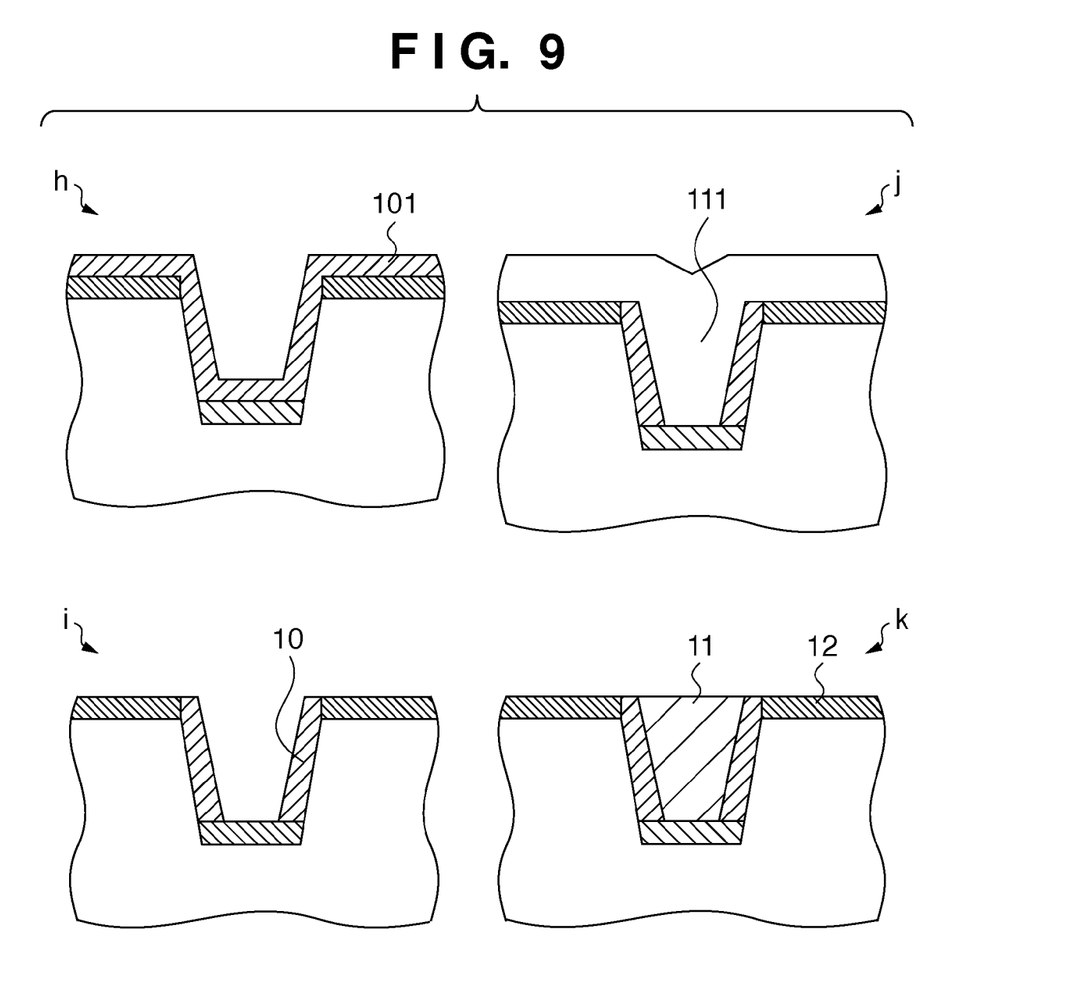
FIG. 9 is a sectional view showing steps in a method of manufacturing an element isolation portion in the pixel array region of the photoelectric conversion device.

A method of manufacturing an element isolation portion in the pixel array region of the photoelectric conversion device is different from that in the first embodiment in that steps h to k in FIG. 9 are executed instead of steps e to g in FIG. 5.

In step h of FIG. 9, a resist 24 is removed using a chemical solution such as sulfuric acid. Then, a third insulation film 101 is formed on a bottom face 216a and side face 216b (see a of FIG. 5) of a trench 216 by EB evaporation (Electronic Beam evaporation) or the like. The third insulation film 101 is formed of, for example, $MgF_2$.

In step i of FIG. 9, anisotropic etching is performed. More specifically, a part of the third insulation film 101 (see h in FIG. 9) that is arranged on the bottom face 216a (see FIG. 5) of the trench 216 and a part of the third insulation film 101 that is arranged on the surface of the semiconductor substrate are etched to leave a part of the third insulation film 101 that is arranged on the side face 216b of the trench 216, thereby forming a reflection portion 10.

In step j of FIG. 9, a second insulation film 111 is buried in the trench 216 by HDP (High Density Plasma) or the like.

In step k of FIG. 9, the surface of the second insulation film 111 is planarized by CMP or the like, forming an element isolation portion 11. At this time, the silicon nitride film 12 functions as a stopper when planarizing the surface by CMP or the like.

The reflection portion 10 may also be formed of LiF. The refractive index of LiF is about 1.4. The reflection portion 10 may also be formed of another transparent insulation film having a refractive index of 1.45 or less. As the refractive index of the reflection portion 10 decreases, the critical angle θ of total reflection given by equation (3) decreases to easily increase a reflectance at the interface between the element isolation portion 11 and the second semiconductor region 5-2:

$$\sin \theta = (nA)/(nB) \quad (3)$$

where θ is the critical angle, nA is the refractive index of the element isolation portion 11, and nB is the refractive index of the reflection portion 10.

Figure 7:
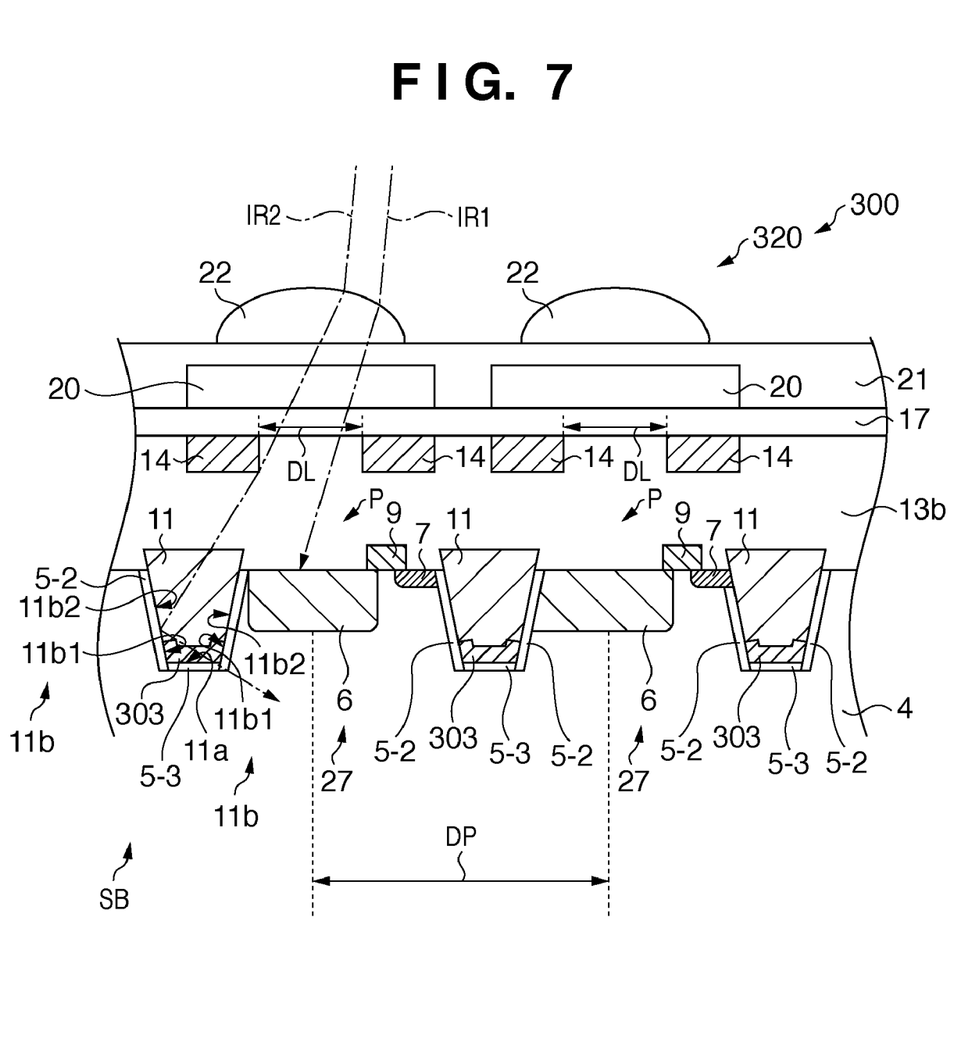
FIG. 7 is a sectional view showing the sectional structure of a photoelectric conversion device according to the second embodiment of the present invention.

The reflection portion 10 may also be arranged in the structure of FIG. 7. This structure can be manufactured by executing steps h to k in FIG. 9 after steps of manufacturing the structure of FIG. 7 in a method of manufacturing an element isolation portion in the pixel array region of the photoelectric conversion device. In this case, the reflection portion 10 is arranged on a part of the side face of the element isolation portion on which no antireflection portion 303 is arranged.

The reflection portion 10 may also be formed of a metal instead of a material lower in refractive index than silicon oxide. The reflectance of a metal is determined by the film thickness d, the complex refractive index "n−i·κ", and the surface roughness (RMS roughness) σ. The material of the reflection portion 10 is preferably one having a small real part n and small imaginary part κ (corresponding to the optical absorption coefficient) of the complex refractive index, and is preferably one having heat resistance because high-temperature annealing is done in a subsequent manufacturing step. Examples of a metal film applicable as the reflection portion 10 are a W (tungsten) film and Mo (molybdenum) film. When the film thickness d of the reflection portion 10 is small, light may pass through the reflection portion 10, and the reflectance may decrease. To prevent this, the film thickness d of the reflection portion 10 is preferably 10 nm or more although it depends on the value of the imaginary part κ of the complex refractive index of a metal used for the reflection portion 10.

When forming a metal film as the reflection portion 10, a metal film suffices to be formed on the bottom face 216a and side face 216b (see a of FIG. 5) of the trench 216 by CVD or the like in step h of FIG. 9. For example, when forming a W metal film by PE-CVD (Plasma Enhanced CVD), the temperature in the chamber is set to about 300° C., and $WF_6+H_6$ source gas is used.

Figure 10:
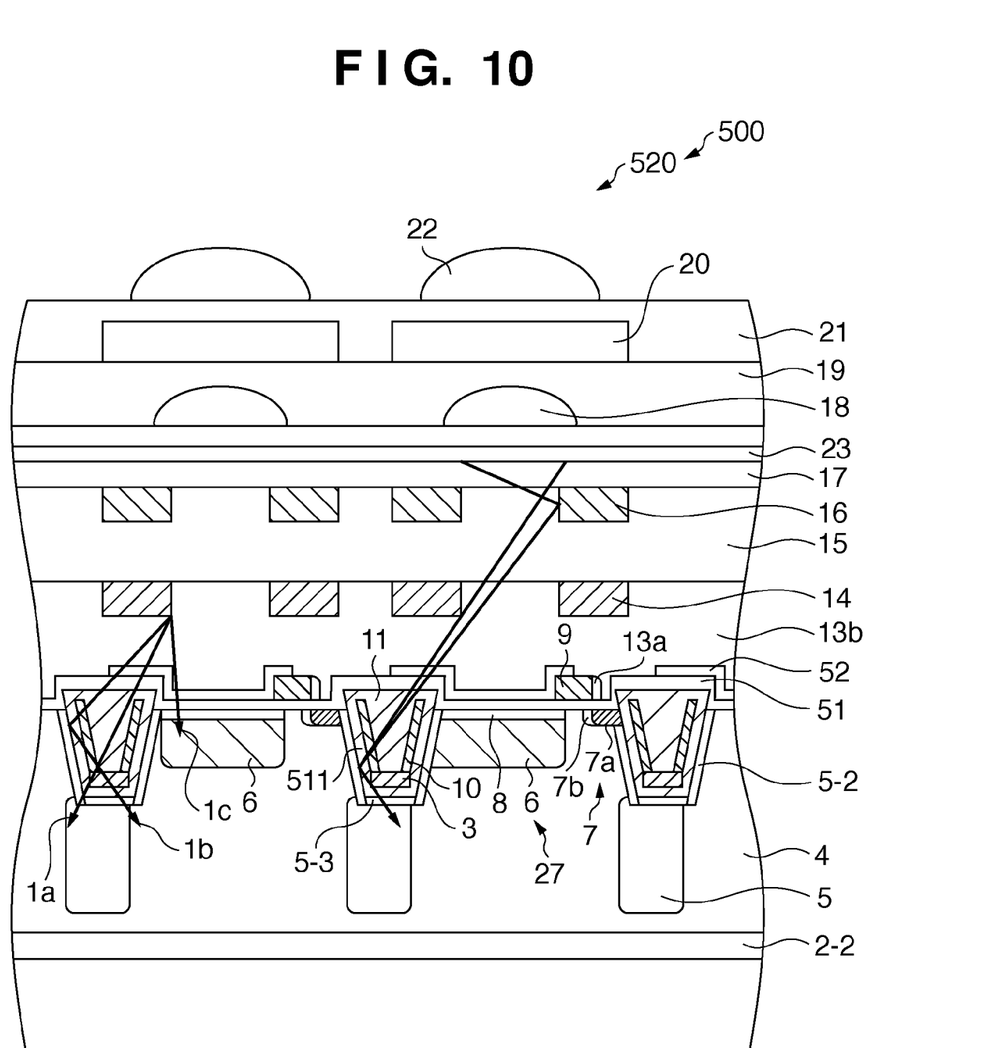
FIG. 10 is a sectional view showing the sectional structure of a photoelectric conversion device according to the fourth embodiment of the present invention.

A photoelectric conversion device 500 according to the fourth embodiment of the present invention will be explained with reference to FIG. 10. A difference from the first embodiment (see FIG. 2), its modification (see FIG. 3), and the third embodiment will be mainly explained, and a description of the same part will not be repeated.

In a pixel array region 520 of the photoelectric conversion device 500, a stress relaxation layer 511 is arranged on the bottom and side faces (a bottom face 11a and side face 11b in FIG. 2) of an element isolation portion 11. The stress relaxation layer 511 relaxes a stress between an antireflection portion 3 and a first semiconductor region 5-3 to prevent generation of a crack in the antireflection portion 3. Also, the stress relaxation layer 511 relaxes a stress between a reflection portion 10 and the second semiconductor region 5-2 to prevent generation of a crack in the reflection portion 10. The stress relaxation layer 511 is formed of, for example, silicon oxide. The stress relaxation layer 511 is preferably thin enough not to obstruct the function of the antireflection portion 3 for preventing reflection of light on the bottom face of the element isolation portion 11.

A method of manufacturing an element isolation portion in the pixel array region of the photoelectric conversion device is different from the first embodiment in the following points.

In step a of FIG. 5, a trench 216 is formed on the surface of a semiconductor substrate SB, and then the semiconductor substrate SB is exposed to high-temperature steam. A bottom face 216a and side face 216b of the trench 216 are thermally oxidized to form a stress relaxation layer 511.

The embodiments of the present invention have been described. However, the present invention is not limited to them, and can be properly modified.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-064822, filed Mar. 13, 2008, which is hereby incorporated by reference herein in its entirety.

What is claimed is:

1. A photoelectric conversion device comprising:
a plurality of photoelectric conversion units each generating charges corresponding to light;
an element isolation portion which electrically isolates the plurality of photoelectric conversion units;
an antireflection portion which is arranged to prevent reflection of light, which has entered the element isolation portion from above the element isolation portion, only on a bottom face of the element isolation portion or only on the bottom face and a lower part of a side face of the element isolation portion; and
a first semiconductor region which is arranged below the element isolation portion,
wherein a refractive index of the antireflection portion takes a value between a refractive index of the element isolation portion and a refractive index of the first semiconductor region.

2. The device according to claim 1, wherein
the first semiconductor region is formed of silicon,
the element isolation portion is formed of silicon oxide, and
the antireflection portion is formed of silicon nitride.

3. The device according to claim 1, further comprising a reflection portion which is arranged to reflect light, which has entered the element isolation portions from above the element isolation portions, on at least an upper part of the side face of the element isolation portion.

4. The device according to claim 3, further comprising a second semiconductor region which is arranged adjacent to the side face of the element isolation portion,
wherein a difference between a refractive index of the reflection portion and a refractive index of the second semiconductor region is larger than a difference between a refractive index of the element isolation portion and the refractive index of the second semiconductor region.

5. The device according to claim 4, wherein
the second semiconductor region is formed of silicon,
the element isolation portion is formed of silicon oxide, and
the reflection portion is formed of a material lower in refractive index than silicon oxide.

6. The device according to claim 3, further comprising a second semiconductor region which is arranged adjacent to the side face of the element isolation portion,
wherein the second semiconductor region is formed of silicon,
the element isolation portion is formed of silicon oxide, and
the reflection portion is formed of a metal.

7. An imaging system comprising:
a photoelectric conversion device defined in claim 1;
an optical system which forms an image on an image sensing surface of the photoelectric conversion device; and
a signal processing unit which processes a signal output from the photoelectric conversion device to generate image data.

8. The device according to claim 1, wherein the antireflection portion reduces a reflectance at an interface between the element isolation portion and the first semiconductor region.

9. A photoelectric conversion device comprising:
a plurality of photoelectric conversion units each generating charges corresponding to light;
an element isolation portion which electrically isolates the plurality of photoelectric conversion units; and
an antireflection portion which are arranged to prevent reflection of light, which has entered the element isolation portion from above the element isolation portion, only on a bottom face of the element isolation portion or only on the bottom face and a lower part of a side face of the a element isolation portion; and
a plurality of color filters which are arranged above the plurality of photoelectric conversion units,
wherein a thickness of the antireflection portion has a value enough to prevent reflection of light having entered the element isolation portion after having passed through the color filter.

10. The device according to claim 9, wherein
the plurality of color filters include primary color filters, and
the thickness of the antireflection portion has a value which is more than 30 nm inclusive and which is less than 105 nm inclusive.

* * * * *